(12) United States Patent
Frigo et al.

(10) Patent No.: US 10,247,795 B2
(45) Date of Patent: Apr. 2, 2019

(54) METHOD AND APPARATUS FOR NON-INVASIVE ASSESSMENT OF RIPPLE CANCELLATION FILTER

(71) Applicant: General Electric Company, Schenectady, NY (US)

(72) Inventors: Louis Martin Frigo, Brookfield, WI (US); Melissa Jean Freeman, Oconomowoc, WI (US); Margaret Ann Wiza, New Berlin, WI (US); Douglas Link, Lake Mills, WI (US); Michael Thomas Rose, Wauwatosa, WI (US); Scott Richard Weber, West Allis, WI (US); Andrew John Panos, Milwaukee, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 979 days.

(21) Appl. No.: 14/585,554

(22) Filed: Dec. 30, 2014

(65) Prior Publication Data
US 2016/0187444 A1  Jun. 30, 2016

(51) Int. Cl.
*G01R 33/385* (2006.01)
*G01R 33/38* (2006.01)

(52) U.S. Cl.
CPC ......... *G01R 33/3852* (2013.01); *G01R 33/38* (2013.01)

(58) Field of Classification Search
CPC ............ A61B 5/0452; G05B 19/41835; G05B 2219/41232; G01K 2210/3216; G01K 11/1786; G10L 21/0216; H02M 1/143; H02M 1/144; H02M 3/156; H03H 2007/013; H03H 21/0021; H03H 7/06; G01R 33/3852
See application file for complete search history.

(56) References Cited

U.S. PATENT DOCUMENTS

| 3,551,780 | A | 12/1970 | Gautherin |
|---|---|---|---|
| 6,026,126 | A | 2/2000 | Gaetano |
| 7,429,851 | B2 | 9/2008 | Nishida |
| 8,324,869 | B2 | 12/2012 | Nguyen et al. |
| 8,629,579 | B2 | 1/2014 | Shen et al. |
| 2004/0098213 | A1 | 5/2004 | Gerlach |
| 2008/0258949 | A1* | 10/2008 | Galton ............... H03M 1/1004 341/120 |

(Continued)

OTHER PUBLICATIONS

International Search Report and Written Opinion for International Application No. PCT/US2015/066421 dated May 4, 2016. 10 pages.

*Primary Examiner* — Ruifeng Pu
(74) *Attorney, Agent, or Firm* — Grogan, Tuccillo & Vanderleeden, LLP

(57) ABSTRACT

A method that includes deriving a first power spectral density function of a signal input to a ripple cancellation filter; deriving a second power spectral density function of a signal concurrently output from the ripple cancellation filter; frequency shaping the first power spectral density according to a spectral rejection image of the ripple cancellation filter to obtain a test power spectral density; and indicating a degraded performance of the ripple cancellation filter in the event that the test and second power spectral density functions fail to match within pre-determined criteria.

20 Claims, 8 Drawing Sheets

(56) References Cited

U.S. PATENT DOCUMENTS

| | | | |
|---|---|---|---|
| 2008/0262367 A1* | 10/2008 | Mugler | A61B 5/0452 600/523 |
| 2010/0073971 A1 | 3/2010 | Reiter et al. | |
| 2010/0117615 A1 | 5/2010 | Prodic et al. | |
| 2010/0239098 A1* | 9/2010 | Christoph | G10L 21/0272 381/56 |
| 2010/0312365 A1* | 12/2010 | Levin | G05B 19/41835 700/37 |
| 2013/0183916 A1 | 7/2013 | Khlat et al. | |
| 2014/0252973 A1 | 9/2014 | Liu | |
| 2016/0191010 A1* | 6/2016 | Freeman | H03H 7/06 333/177 |
| 2016/0196818 A1* | 7/2016 | Christoph | G10K 11/1786 381/71.6 |
| 2016/0369734 A1* | 12/2016 | Ferguson | H02M 3/156 |

* cited by examiner

US 10,247,795 B2

METHOD AND APPARATUS FOR NON-INVASIVE ASSESSMENT OF RIPPLE CANCELLATION FILTER

BACKGROUND

Technical Field

Embodiments of the invention relate generally to noise filtering in imaging systems. Particular embodiments relate to filtering gradient coil power amplifier noise in magnetic resonance imaging (MRI) systems.

Discussion of Art

Generally, the quality of images produced by an MRI system will be affected by the repeatability and fidelity of its electronic components. In particular, gradient subsystem power amplifiers strongly influence the fidelity with which a scan volume is voxellated (scanned in volume segments of equal size and common orientation). For example, power amplifier ripple or swerve can degrade a desired uniformity of voxel size and orientation.

Accordingly, MRI systems are provided with apparatus for correcting images in response to deviations in the performance of electronic components such as the gradient subsystem power amplifiers. One such apparatus is a ripple cancellation filter, which is provided to reduce switching noise produced at the gradient coil by pulse width modulating the gradient power supply. Typically, the ripple cancellation filter is a hidden component that becomes known to an end user only while trying to diagnose a source for narrowband noise (at about the pulse width modulation frequency of the gradient coil power amplifiers) in an expensive set of MR images. Determining whether a ripple cancellation filter is properly working has typically been an invasive exercise of opening up the filter box and using hand instruments to read component electrical parameters.

In view of the above, it is desirable to provide apparatus and methods for proactively and non-invasively assessing performance of a ripple cancellation filter within an MRI system. Such apparatus and methods might also be helpful toward real-time assessing performance of ripple cancellation filters in other types of electronic systems.

BRIEF DESCRIPTION

Embodiments of the invention implement a method that includes deriving a first power spectral density function of a signal input to a ripple cancellation filter; deriving a second power spectral density function of a signal concurrently output from the ripple cancellation filter; frequency shaping the first power spectral density according to a spectral rejection image of the ripple cancellation filter to obtain a test power spectral density; and indicating a degraded performance of the ripple cancellation filter in the event that the test and second power spectral density functions fail to match within pre-determined criteria.

Other embodiments implement a method that includes deriving a first power spectral density of a signal produced by operation of a pulse width modulator; deriving a second power spectral density of a signal concurrently output from a ripple cancellation filter; frequency shaping the first power spectral density according to a design spectral rejection image of the ripple cancellation filter to obtain a test power spectral density; and indicating a degraded performance of the ripple cancellation filter in the event that the test and second power spectral density functions fail to match within pre-determined criteria.

Certain embodiments provide an apparatus that includes a filter assessment module that derives a first power spectral density function of a signal input to a ripple cancellation filter, derives a second power spectral density function of a signal concurrently output from the ripple cancellation filter, obtains a design spectral rejection image of the ripple cancellation filter based on a concurrent pulse width modulator output, multiplies the first power spectral density function by the design spectral rejection image to obtain a test spectral power density function, and indicates a degraded performance of the ripple cancellation filter in the event that the test and second power spectral density functions fail to match within pre-determined criteria.

Other embodiments provide an apparatus that includes a pulse width modulator; an image processing module that receives an input signal possibly including switching noise produced by the pulse width modulator; a ripple cancellation filter that samples the pulse width modulator output to produce a rejection image for removing the switching noise from the input signal to the image processing module; and a filter assessment module that derives a first power spectral density function of the pulse width modulator output, derives a second power spectral density function of a signal output from the ripple cancellation filter, multiplies the first power spectral density function by the rejection image to produce a test power spectral density, and indicates to the image processing module a degraded performance of the ripple cancellation filter in the event that the test and second power spectral density functions fail to match within pre-determined criteria.

DRAWINGS

The present invention will be better understood from reading the following description of non-limiting embodiments, with reference to the attached drawings, wherein below:

DETAILED DESCRIPTION

Figure 1:
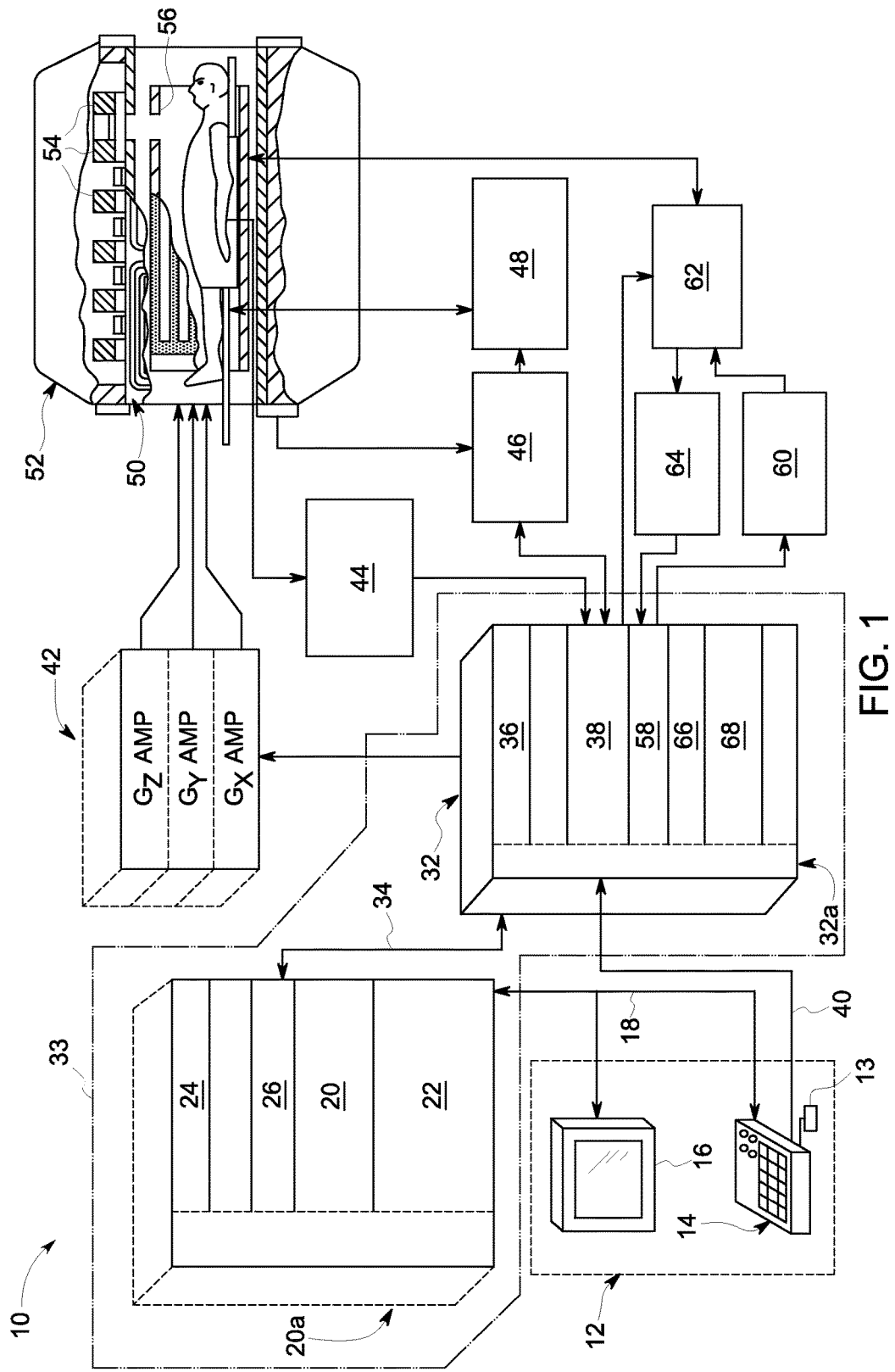
FIG. 1 shows schematically an exemplary magnetic resonance imaging (MRI) system in which embodiments of the present invention are implemented.

Reference will be made below in detail to exemplary embodiments of the invention, examples of which are illustrated in the accompanying drawings. Wherever possible, the same reference characters used throughout the drawings refer to the same or like parts, without duplicative description. Although exemplary embodiments of the present invention are described with respect to MRI systems for clarity of illustration, embodiments of the invention also are applicable for assessing the performance of a ripple cancellation filter in real-time, generally.

As used herein, the terms "substantially," "generally," and "about" indicate conditions within reasonably achievable manufacturing and assembly tolerances, relative to ideal desired conditions suitable for achieving the functional purpose of a component or assembly. The term "real-time" means substantially concurrent with and responsive to an ongoing process, i.e. capable of providing a feedback signal to interrupt the ongoing process in response to a monitored process variable exceeding a threshold.

FIG. 1 shows major components of an exemplary magnetic resonance imaging (MRI) system 10 that incorporates and is configured for use with embodiments of the present invention. The operation of the system is controlled from an operator console 12, which includes a keyboard or other input device 13, a control panel 14, and a display screen 16. The input device 13 can include a mouse, joystick, keyboard, track ball, touch activated screen, light wand, voice control, or any similar or equivalent input device, and may be used for interactive geometry prescription. The console 12 communicates through a link 18 with a separate computer system 20 that enables an operator to control the production and display of images on the display screen 16. The computer system 20 includes a number of modules that communicate with each other through a backplane 20a. The modules of the computer system 20 include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate MRI system control 32 through a high-speed signal link 34. The computer system 20 and the MRI system control 32 collectively form an "MRI controller" 33. According to embodiments and aspects of the invention, the MRI controller 33 is configured to accomplish a method for separately imaging water, fat, and silicone, for example by implementing an exemplary algorithm that is further discussed below.

The MRI system control 32 includes a set of modules connected together by a backplane 32a. These include a CPU module 36 as well as a pulse generator module 38. The CPU module 36 connects to the operator console 12 through a serial link 40. It is through link 40 that the MRI system control 32 receives commands from the operator to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to several components that are operated by the MRI controller 33, including the pulse generator module 38 (which controls a gradient amplifier 42, further discussed below), a physiological acquisition controller ("PAC") 44, and a scan room interface circuit 46.

The CPU module 36 receives patient data from the physiological acquisition controller 44, which receives signals from a number of different sensors connected to the patient, such as ECG signals from electrodes attached to the patient. And finally, the CPU module 36 receives from the scan room interface circuit 46, signals from various sensors associated with the condition of the patient and the magnet system. It is also through the scan room interface circuit 46 that the MRI controller 33 commands a patient positioning system 48 to move the patient or client C to a desired position for the scan.

The pulse generator module 38 operates the gradient amplifiers 42 to achieve desired timing and shape of the gradient pulses that are produced during the scan. The gradient waveforms produced by the pulse generator module 38 are applied to the gradient amplifier system 42 having Gx, Gy, and Gz amplifiers. Each gradient amplifier excites a corresponding physical gradient coil x, y, or z in a gradient coil assembly, generally designated 50, to produce the magnetic field gradients used for spatially encoding acquired signals. The gradient coil assembly 50 forms part of a magnet assembly 52, which also includes a polarizing magnet 54 (which, in operation, provides a homogeneous longitudinal magnetic field B0) and a whole-body RF coil 56 (which, in operation, provides a transverse magnetic field B1 that is generally perpendicular to B0). In an embodiment of the invention, RF coil 56 is a multi-channel coil. A transceiver module 58 in the MRI system control 32 produces pulses that are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 32 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either transmit mode or receive mode.

After the multi-channel RF coil 56 picks up the RF signals produced from excitation of the target, the transceiver module 58 digitizes these signals. The MRI controller 33 then processes the digitized signals by Fourier transform to produce k-space data, which then is transferred to a memory module 66, or other computer readable media, via the MRI system control 32. "Computer readable media" may include, for example, structures configured so that electrical, optical, or magnetic states may be fixed in a manner perceptible and reproducible by a conventional computer: e.g., text or images printed to paper or displayed on a screen, optical discs, or other optical storage media; "flash" memory, EEPROM, SDRAM, or other electrical storage media; floppy or other magnetic discs, magnetic tape, or other magnetic storage media.

A scan is complete when an array of raw k-space data has been acquired in the computer readable media 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long-term storage or it may be further processed by the image processor 22 and conveyed to the operator console 12 and presented on the display 16.

As mentioned above, during operation of the MRI system 100 for an MRI scan, the pulse generator module 38 applies gradient waveforms to the gradient coil assembly 50 via the gradient amplifier system 42. The gradient waveforms drive corresponding gradient coils to locally adjust magnetization of a scan volume enclosed by the magnet assembly 52. In particular, the gradient waveforms provide Frequency Encoding, Phase Encoding, and Slice Selection gradients of magnetization in order to define a specific region of interest for an MRI experiment within the magnet assembly 52.

Figure 2:
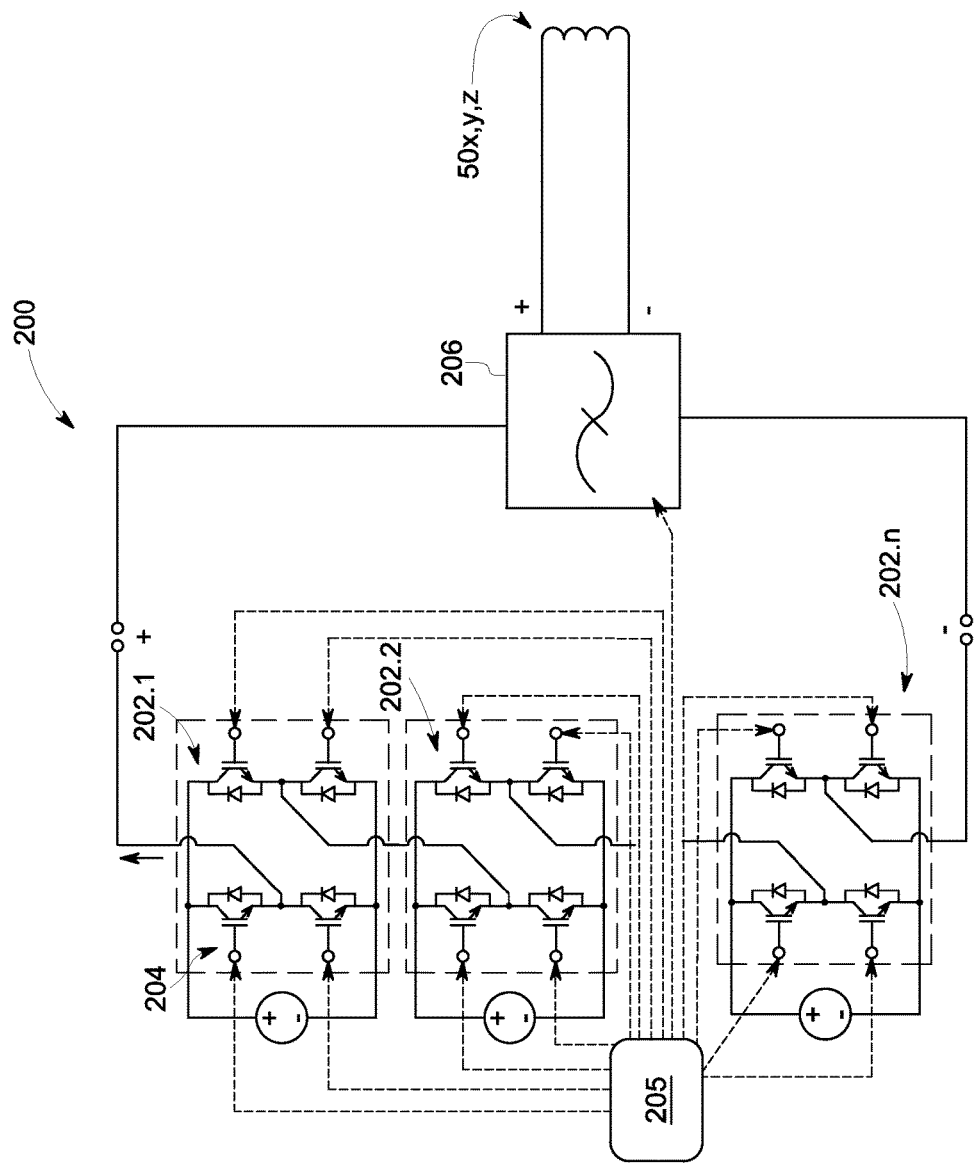
FIG. 2 shows schematically a gradient power amplifier and a ripple cancellation filter used in the exemplary MRI system of FIG. 1.

In an embodiment, the gradient amplifier system 42 includes three gradient amplifiers, one per gradient axis (X, Y, Z). FIG. 2 shows schematically a gradient amplifier 200 that is formed as a stacked topology of plural H-bridge circuits 202.1, 202.2, ... 202.n. The stacked H-bridges 202 are composed of IGBTs 204, which are driven by a PWM controller 205 according to a pulse width modulation algorithm that trades off switching and conductive losses of the IGBTs and bridge interleave schemes. Generally, pulse width modulation (PWM) is a process of turning selected IGBTs on and off, according to a programmed schedule, in order to produce a time-averaged voltage from a DC power supply to a load. The fraction of a PWM schedule for which a device is on is defined as that device's duty cycle. The frequency at which the devices are turning on and off is defined as the PWM switching frequency Fsw of the controller. Although in some schedules (e.g., when PWM is used to simulate AC) the durations of on and off pulse times may vary across a schedule, the switching frequency at which the IGBTs toggle remains constant, i.e., the IGBTs can change state only at an integral multiple of Fsw. The H-bridges 202 are stacked to achieve the required maximum output voltage and in certain embodiments their PWM schedules are interleaved to minimize output filtering requirements.

As mentioned, imaging performance of the MRI system 100 can be influenced by the repeatability and fidelity of the gradient subsystem power amplifiers 200. Therefore, in addition to interleaving PWM schedules, a ripple cancellation filter 206 is connected across the output terminals of the stacked H-bridges 202 in order to mitigate any influence of the gradient amplifier switching noise 200 on imaging performance. The gradient amplifier 200 drives its gradient coils 50x, y, z, via the ripple cancellation filter 206, which is configured to reject spectral energy resulting from the IGBT switching frequency of the pulse width modulation (PWM) controller 205, thus canceling switching noise produced from the stacked H-bridges 202 at harmonics of the PWM frequency.

Figure 3:
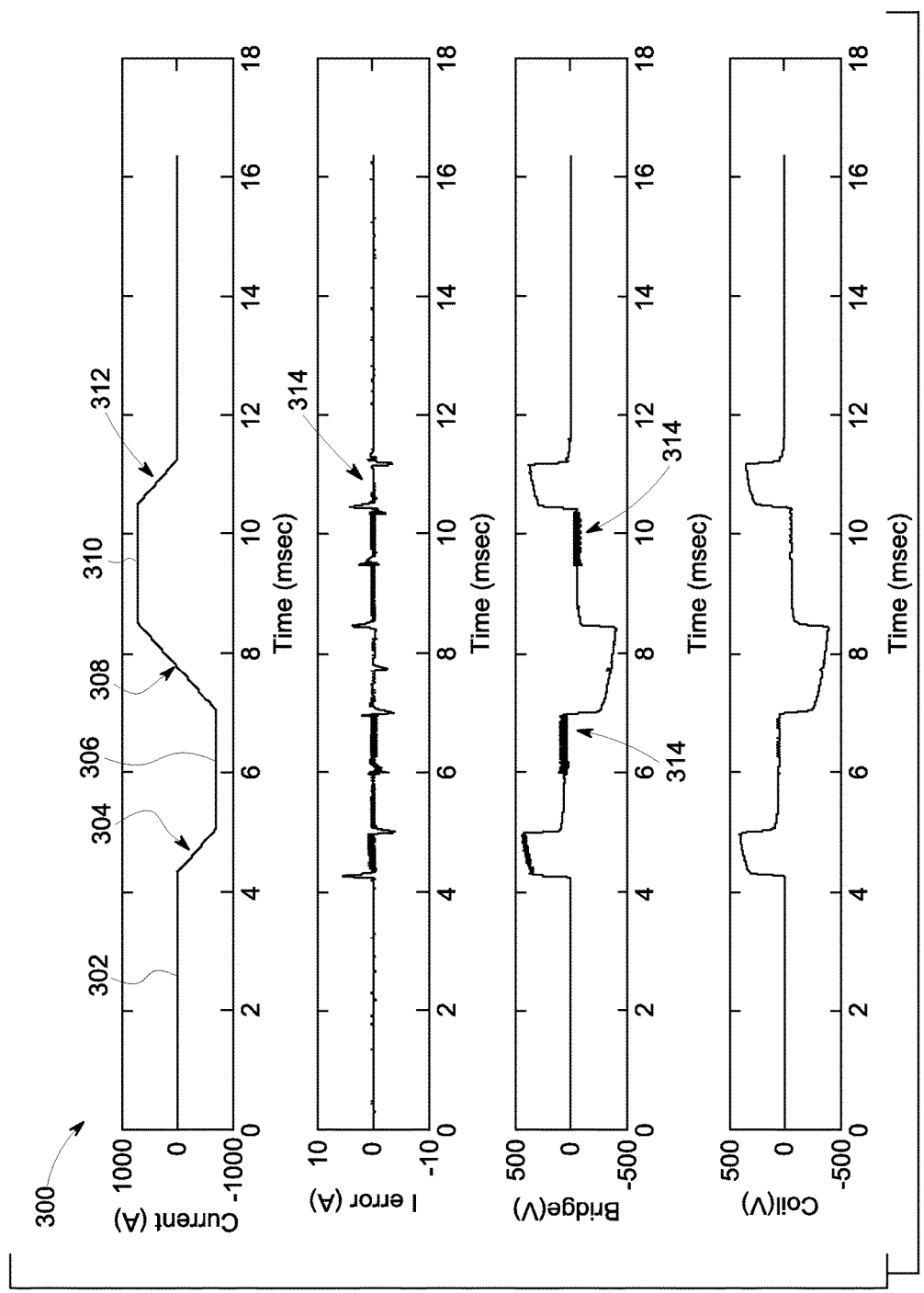
FIG. 3 shows graphically a gradient waveform produced by the gradient power amplifier of FIG. 2, during operation of the MRI system of FIG. 1.

FIG. 3 shows graphically a gradient waveform 300 that is produced by the gradient power amplifier 200 of FIG. 2, during operation of the MRI system 100 of FIG. 1. The gradient waveform 300 has several characteristic phases. These phases include zero regulation 302, negative ramp 304, negative flattop 306, positive ramp 308, positive flattop 310, and zero crossing 312. The magnitude of switching noise 314 and duty cycle vary depending on the phase of the waveform. Thus, one aspect of the invention is that the ripple cancellation filter 206 simultaneous samples duty cycles, bridge voltage (voltage before the ripple cancellation filter 206), and coil voltage (voltage after the ripple cancellation filter 206) to obtain diagnostic information.

In addition to detecting the different phases of the waveform 300, a ripple cancellation filter 206 that implements aspects of the invention will detect two distinct PWM switching frequencies. Although switching noise may be broadband in nature, the invention is focused on filter effectiveness for the fundamental switching noise frequencies. The higher order harmonics will be filtered out of the sampled bridge voltage and coil voltage data. Note if they are present in the sampled data it will not impair the performance of the invention, as long as the spectral management aligns them at frequencies that do not alias back to the fundamental switching frequency.

Figure 4:
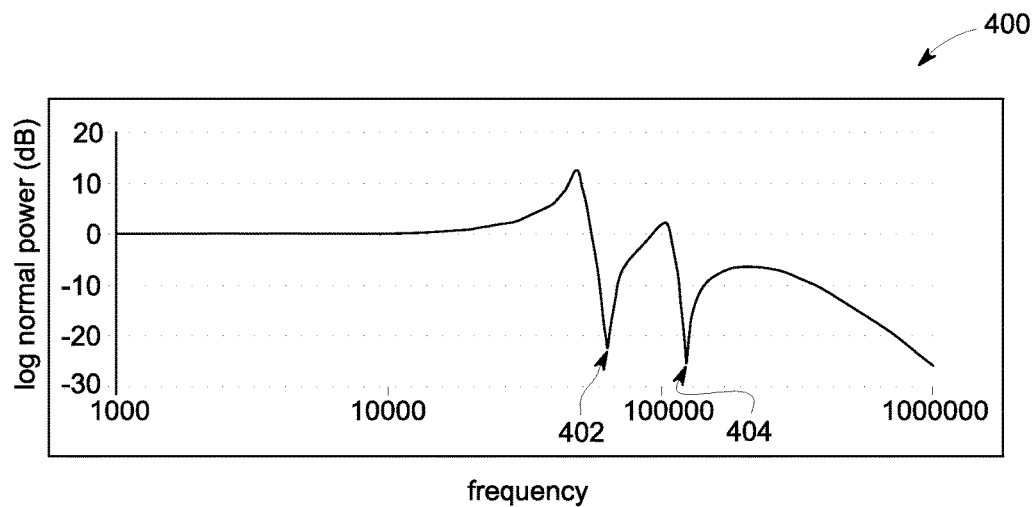
FIG. 4 shows graphically a spectral rejection image of the ripple cancellation filter of FIG. 2.

In embodiments, the ripple cancellation filter 206, as shown in FIG. 2, is configured to provide a dual frequency notch filter. The dual spectral rejection image or mask 400 of the ripple cancellation filter 206 is shown in FIG. 4. Here, the filter rejection mask 400 describes the limits of expected spectral image rejection for the ripple cancellation filter 206 at a given coil voltage across a frequency range. The rejection image 400 has two distinct notches 402, 404 that are aligned with fundamentals of the switching noise 314, as sampled from the gradient waveform 300. For example, the ripple cancellation filter 206 may be configured to obtain or calculate a power spectrum density of the switching noise 314 and to set the notches 402, 404 against local maxima of that power spectrum density. Therefore, the notches 402, 404 should reject the majority of spectral energy from pulse width modulation switching events.

Figure 5:
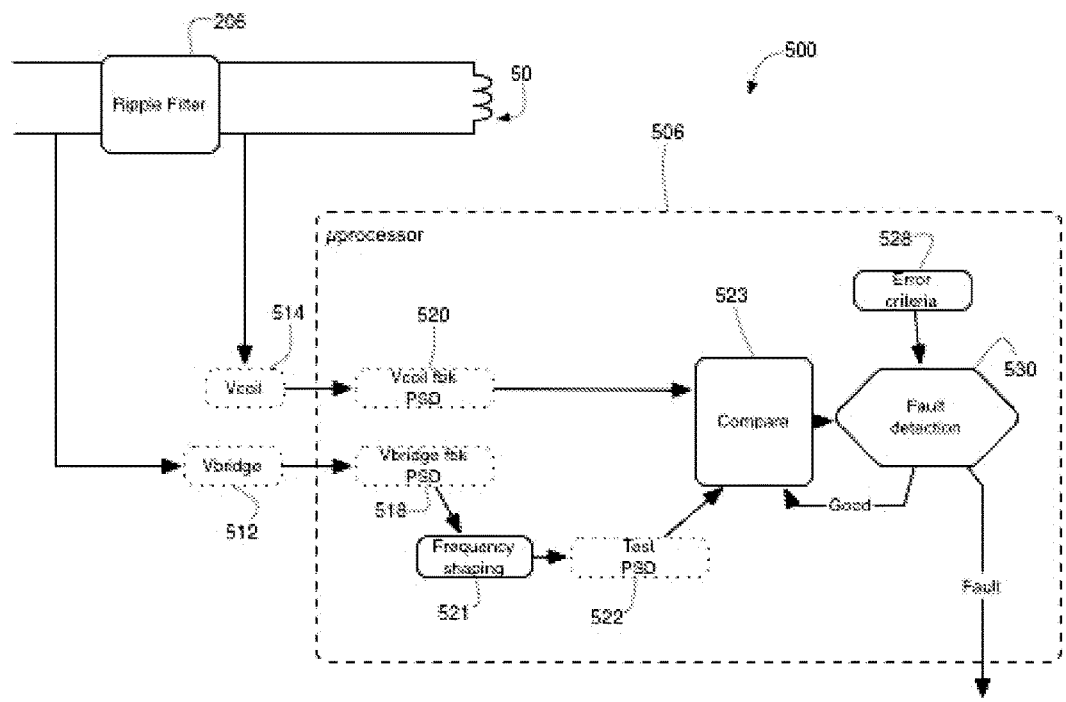
FIG. 5 shows schematically a filter assessment module configured to implement a method for monitoring performance of the ripple cancellation filter of FIG. 2, according to an embodiment of the invention.

In order to evaluate the performance of the ripple cancellation filter 206, for example in order to evaluate whether the dual notches 402, 404 have been appropriately set, FIG. 5 shows schematically a filter assessment module 500 according to an embodiment of the invention. The filter assessment module 500 includes a microprocessor 506, which is operatively connected with the ripple cancellation filter 206 for simultaneously sampling filter input (bridge voltage) data 512 and filter output (coil voltage) data 514.

The filter assessment module may include at least one A/D converter and a multiplexer (interposed between the ripple cancellation filter 206 and the microprocessor 506) for sampling the filter input and output data at a sample frequency Fs. The A/D converter sample frequencies are provisioned in a manner to allow for measurement of the spectral content of the switching noise 314 (shown in FIG. 3). Typically, the A/D converter sampling frequencies are set such that the two fundamental frequencies of switching noise 314 should occur in the first Nyquist zone of the sampled data and such that sufficient guard bandwidth for anti-aliasing is retained, where the first Nyquist zone is defined as spectrum from DC to Fs/2. Therefore, for Fsw=10 kHz, Fs should equal at least about 250 kHz.

Figure 6:
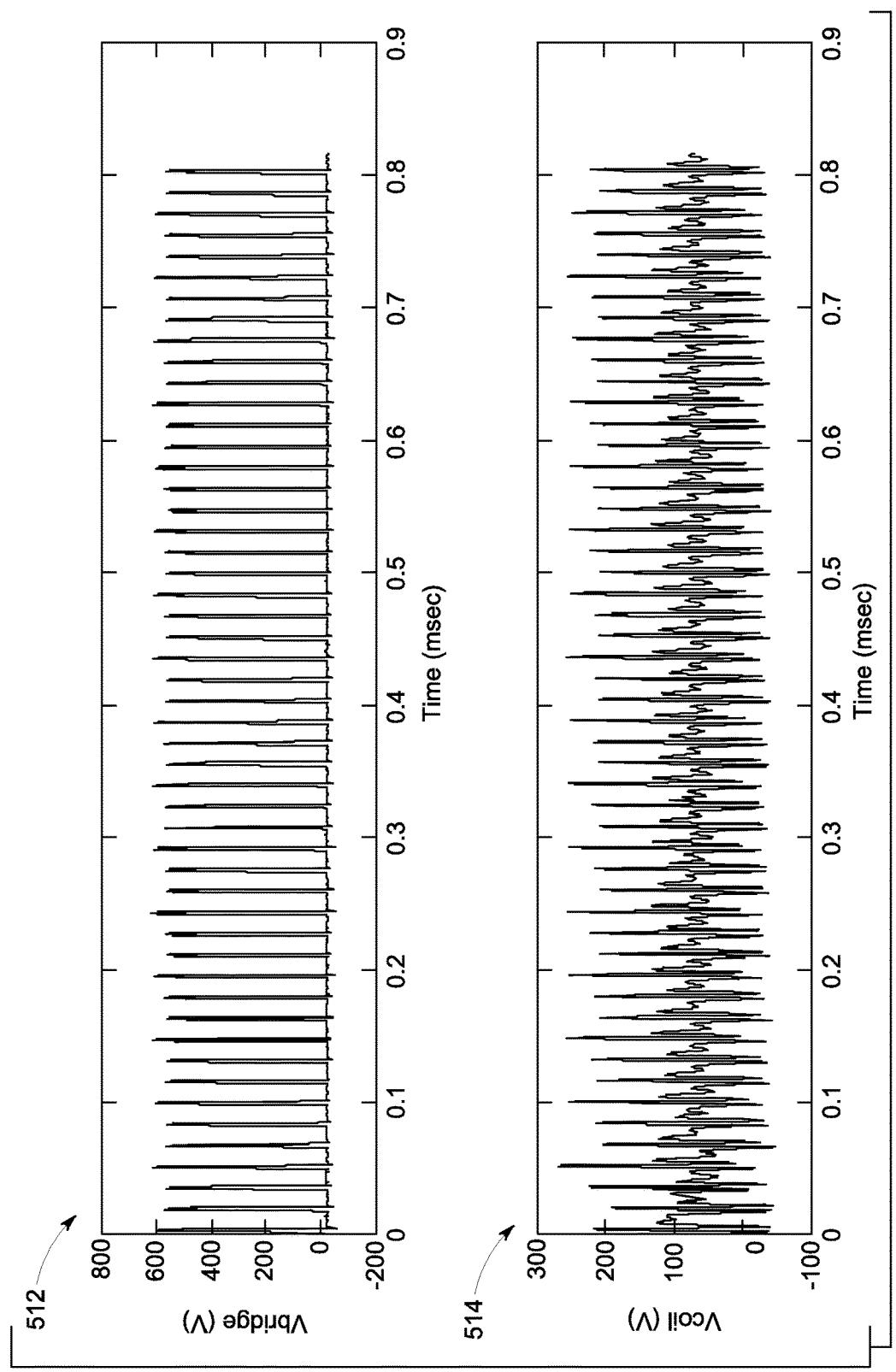
FIG. 6 shows graphically bridge voltage data and coil voltage data, including noise produced by the gradient power amplifier of FIG. 2 at a pulse width modulation frequency of 10 kHz.
Figure 7:
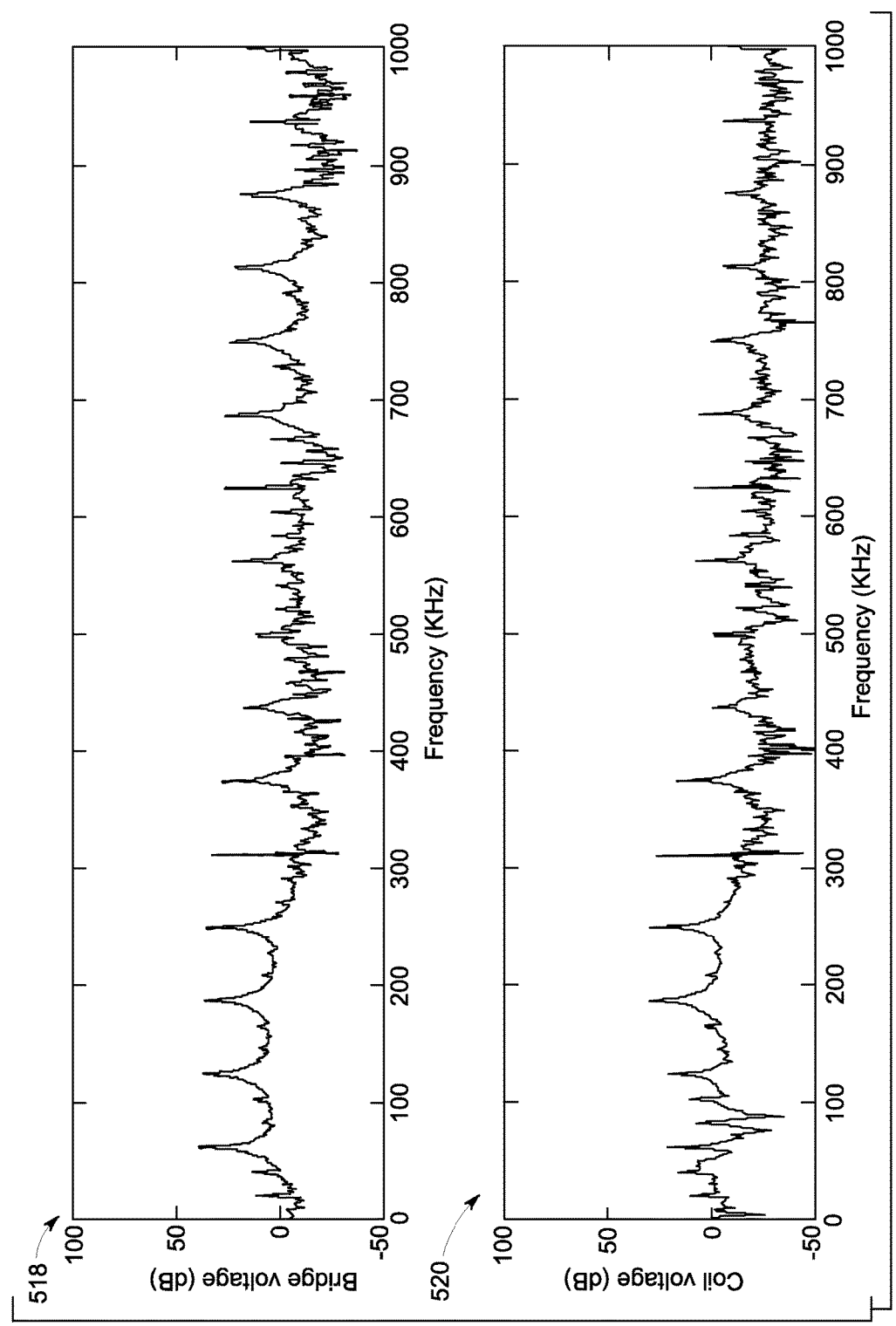
FIG. 7 shows graphically power spectral densities of coil voltage and of bridge voltage, based on the voltage data of FIG. 6.
Figure 8:
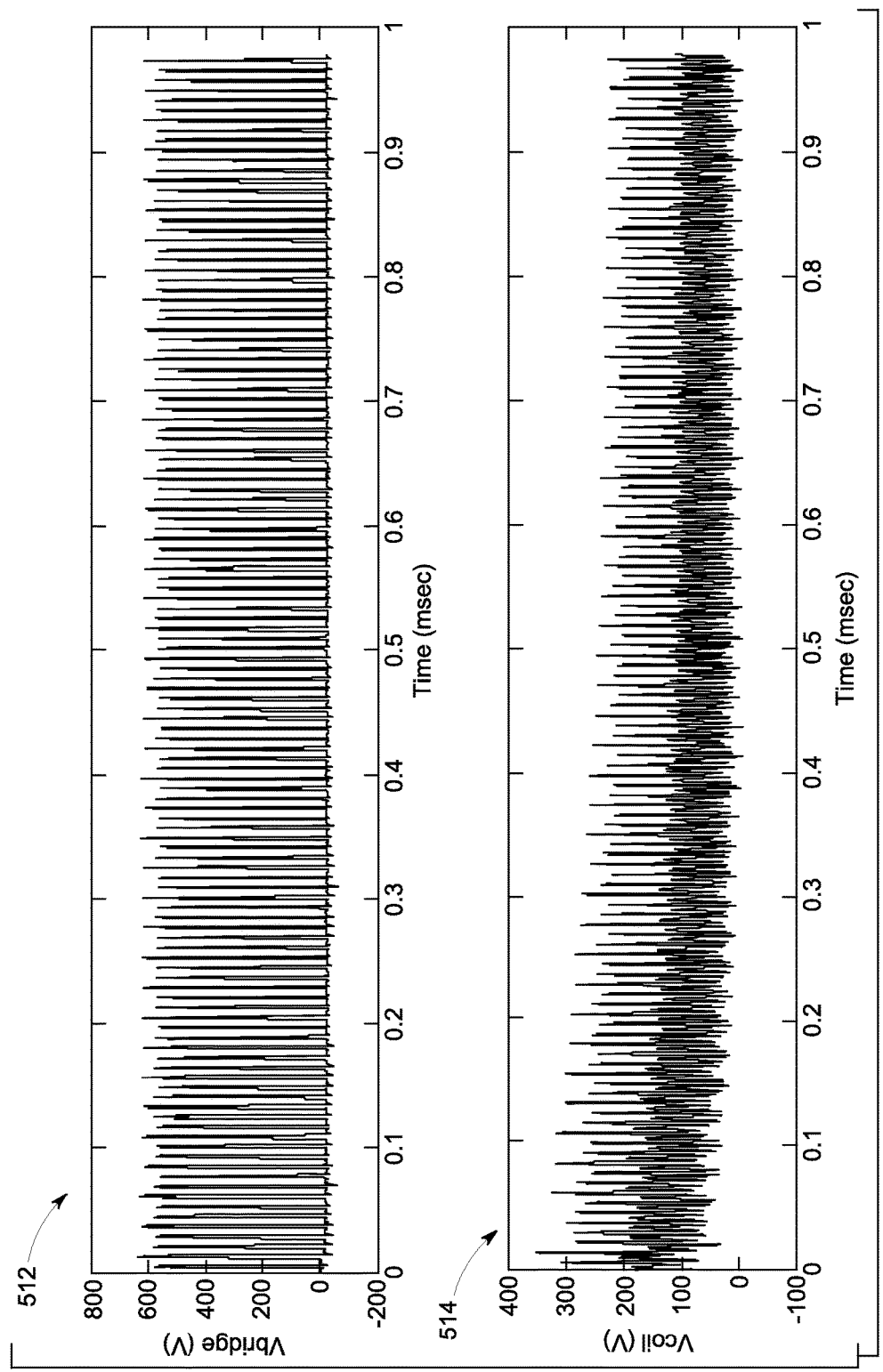
FIG. 8 shows graphically bridge voltage data and coil voltage data, including noise produced by the gradient power amplifier of FIG. 2 at a pulse width modulation frequency of 20 kHz.
Figure 9:
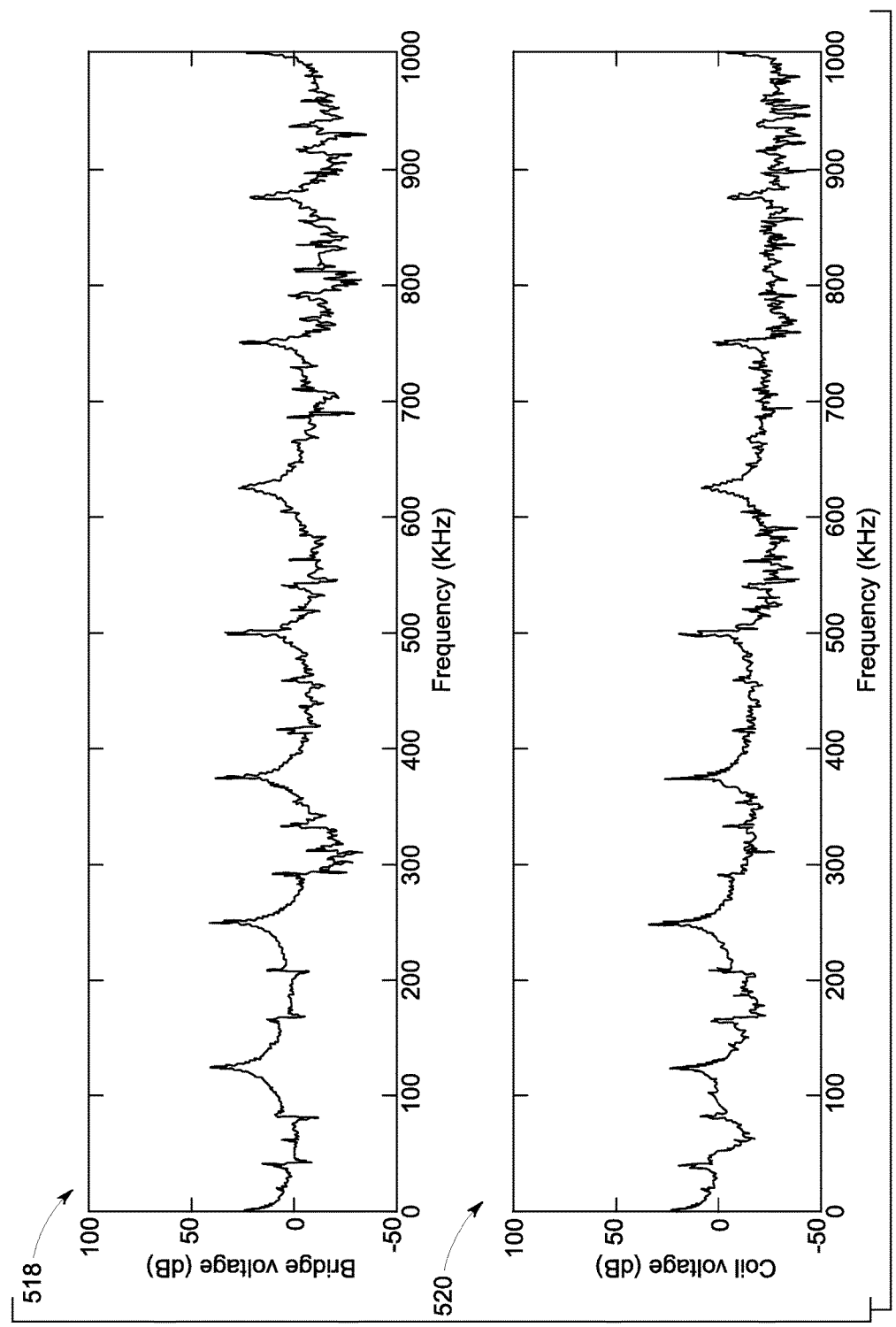
FIG. 9 shows graphically power spectral densities of coil voltage and of bridge voltage, based on the voltage data of FIG. 8.

In an embodiment, the processor 506 is configured to capture bridge voltage data 512 (e.g., a "signal input" to the ripple cancellation filter 206) and coil voltage data 514 (e.g., a "signal concurrently output" from the ripple cancellation filter 206) that then are used by the processor 506 to derive or calculate a bridge voltage (e.g., a "first") power spectral density ("PSD") 518 and a coil voltage (e.g., a "second") power spectral density 520, e.g., by fast, discrete, or truncated Fourier transform or by other modes. FIG. 6 shows graphically the bridge voltage data 512 and the coil voltage data 514, at a pulse width modulation frequency of 10 kHz. FIG. 7 shows graphically the bridge voltage (first) power spectral density 518 (including noise produced by the gradient power amplifier 200) as well as the coil voltage (second) power spectral density 520, based on the voltage data 512, 514 of FIG. 6. FIG. 8 shows graphically the bridge voltage data 512 and the coil voltage data 514, at a pulse width modulation frequency of 20 kHz. FIG. 9 shows graphically the bridge voltage power spectral density 518

(including noise produced by the gradient power amplifier 200) as well as the coil voltage spectral density 520, based on the voltage data 512, 514 of FIG. 8.

Therefore, the processor 506 captures bridge voltage data 512 and coil voltage data 514 that are used by the processor 506 to calculate a bridge voltage power spectral density 518 and a coil voltage spectral density 520. FIG. 6 shows graphically the bridge voltage data 512 and the coil voltage data 514, at a pulse width modulation frequency of 10 kHz. FIG. 7 shows graphically the bridge voltage power spectral density 518 (including noise produced by the gradient power amplifier 200) as well as the coil voltage spectral density 520, based on the voltage data 512, 514 of FIG. 6. FIG. 8 shows graphically the bridge voltage data 512 and the coil voltage data 514, at a pulse width modulation frequency of 20 kHz. FIG. 9 graphically depicts the bridge voltage power spectral density 518 (including noise produced by the gradient power amplifier 200) as well as the coil voltage spectral density 520, based on the voltage data 512, 514 of FIG. 8.

In case the ripple cancellation filter 206 is operating normally, the coil voltage power spectral density 520 should be about equal to the bridge voltage power spectral density 518 multiplied by the ripple cancellation filter's design spectral rejection image 400. Therefore, according to an aspect of the invention, the processor 506 is configured to sporadically multiply the bridge voltage power spectral density 518 by the spectral rejection image ("frequency shaping" 521), in order to obtain a test power spectral density 522 that then is compared 523 to the coil voltage power spectral density 520. For example, the test power spectral density 522 and the coil voltage power spectral density 520 can be integrated across a sampling bandwidth surrounding each of the fundamental noise frequencies (e.g., for a 3-bridge configuration of the gradient power amplifier 200, 62.5 kHz for 10.41 kHz switching frequency or 125 kHz for 20.83 kHz PWM frequency). In case a difference of the integrals exceeds a threshold value 528, then the assessment module 500 detects 530 that the ripple cancellation filter 206 has a problem that can degrade imaging quality of the MRI system 100. Alternatively, other error criteria 528 can be utilized.

Thus, embodiments of the invention implement a method that includes deriving a first power spectral density function of a signal input to a ripple cancellation filter; deriving a second power spectral density function of a signal concurrently output from the ripple cancellation filter; frequency shaping the first power spectral density according to a spectral rejection image of the ripple cancellation filter to obtain a test power spectral density; and indicating a degraded performance of the ripple cancellation filter in the event that the test and second power spectral density functions fail to match within pre-determined criteria. The pre-determined criteria may include a difference of less than 5% between power integrals across a sample bandwidth surrounding a fundamental noise frequency. The sample bandwidth may be not less than +/−1% of the fundamental noise frequency. The sample bandwidth may be not more than +/−10% of the fundamental noise frequency. The fundamental noise frequency may be established as a multiple of a pulse width modulator switching frequency. The fundamental noise frequency may be established as a frequency corresponding to a maximum of the first power spectral density function.

Other embodiments implement a method that includes deriving a first power spectral density of a signal produced by operation of a pulse width modulator; deriving a second power spectral density of a signal concurrently output from a ripple cancellation filter; frequency shaping the first power spectral density according to a design spectral rejection image of the ripple cancellation filter to obtain a test power spectral density; and indicating a degraded performance of the ripple cancellation filter in the event that the test and second power spectral density functions fail to match within pre-determined criteria. The pre-determined criteria may include a difference of less than 5% between power integrals across a sample bandwidth surrounding a fundamental noise frequency. The sample bandwidth may be not less than +/−1% of the fundamental noise frequency. The sample bandwidth may be not more than +/−10% of the fundamental noise frequency. The fundamental noise frequency may be established as a multiple of a pulse width modulator switching frequency. The fundamental noise frequency may be established as a frequency corresponding to a maximum of the first power spectral density function.

Certain embodiments provide an apparatus that includes a filter assessment module that derives a first power spectral density function of a signal input to a ripple cancellation filter, derives a second power spectral density function of a signal concurrently output from the ripple cancellation filter, obtains a design spectral rejection image of the ripple cancellation filter based on a concurrent pulse width modulator output, multiplies the first power spectral density function by the design spectral rejection image to obtain a test spectral power density function, and indicates a degraded performance of the ripple cancellation filter in the event that the test and second power spectral density functions fail to match within pre-determined criteria. The pre-determined criteria may include a difference of less than 5% between power integrals across a sample bandwidth surrounding a fundamental noise frequency. The sample bandwidth may be not less than +/−1% of the fundamental noise frequency. The sample bandwidth may be not more than +/−10% of the fundamental noise frequency. The fundamental noise frequency may be established as a multiple of a pulse width modulator switching frequency. The fundamental noise frequency may be established as a frequency corresponding to a maximum of the first power spectral density function.

Other embodiments provide an apparatus that includes a pulse width modulator; an image processing module that receives an input signal possibly including switching noise produced by the pulse width modulator; a ripple cancellation filter that samples the pulse width modulator output to produce a rejection image for removing the switching noise from the input signal to the image processing module; and a filter assessment module that derives a first power spectral density function of the pulse width modulator output, derives a second power spectral density function of a signal output from the ripple cancellation filter, multiplies the first power spectral density function by the rejection image to produce a test power spectral density, and indicates to the image processing module a degraded performance of the ripple cancellation filter in the event that the test and second power spectral density functions fail to match within pre-determined criteria. The pre-determined criteria may include a difference of less than 5% between power integrals across a sample bandwidth surrounding a fundamental noise frequency.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described methods and apparatus, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A method comprising:
    non-invasively sampling an input voltage to a ripple cancellation filter of a magnetic resonance imaging system via a filter assessment module of the magnetic resonance imaging system, the filter assessment module electrically connected to both an input and an output of the ripple cancellation filter;
    transforming, via the filter assessment module, the sampled input voltage into a first power spectral density;
    non-invasively sampling an output voltage of the ripple cancellation filter via the filter assessment module;
    transforming, via the filter assessment module, the sampled output voltage into a second power spectral density;
    frequency shaping, via the filter assessment module, the first power spectral density according to a spectral rejection image of the ripple cancellation filter to obtain a test power spectral density; and
    indicating, via the filter assessment module, a degraded performance of the ripple cancellation filter in the event that the test and second power spectral densities fail to match within pre-determined criteria.

2. The method of claim 1 wherein the pre-determined criteria include a difference of less than 5% between power integrals across a sample bandwidth surrounding a fundamental noise frequency.

3. The method of claim 2 wherein the sample bandwidth is not less than +/−1% of the fundamental noise frequency.

4. The method of claim 3 wherein the sample bandwidth is not more than +/−10% of the fundamental noise frequency.

5. The method of claim 2 wherein the fundamental noise frequency is established as a multiple of a pulse width modulator switching frequency.

6. The method of claim 2 wherein the fundamental noise frequency is established as a frequency corresponding to a maximum of the first power spectral density function.

7. A method comprising:
    non-invasively sampling, via a filter assessment module electrically connected to both an input and an output of a ripple cancellation filter of a magnetic resonance imaging system, a signal produced by operation of a pulse width modulator of the magnetic resonance imaging system;
    transforming, via the filter assessment module, the sampled signal into a first power spectral density;
    non-invasively sampling, via the filter assessment module, an output voltage of the ripple cancellation filter;
    transforming, via the filter assessment module, the sampled output voltage into a second power spectral density;
    frequency shaping, via the filter assessment module, the first power spectral density according to a design spectral rejection image of the ripple cancellation filter to obtain a test power spectral density; and
    indicating, via the filter assessment module, a degraded performance of the ripple cancellation filter in the event that the test and second power spectral densities fail to match within pre-determined criteria.

8. The method of claim 7 wherein the pre-determined criteria include a difference of less than 5% between power integrals across a sample bandwidth surrounding a fundamental noise frequency.

9. The method of claim 8 wherein the sample bandwidth is not less than +/−1% of the fundamental noise frequency.

10. The method of claim 9 wherein the sample bandwidth is not more than +/−10% of the fundamental noise frequency.

11. The method of claim 8 wherein the fundamental noise frequency is established as a multiple of a pulse width modulator switching frequency.

12. The method of claim 8 wherein the fundamental noise frequency is established as a frequency corresponding to a maximum of the first power spectral density function.

13. An apparatus comprising:
a first sensor that non-invasively samples an input voltage to a ripple cancellation filter connected across output terminals of h-bridges of a gradient amplifier of a magnetic resonance imaging system;
a second sensor that non-invasively samples an output voltage of the ripple cancellation filter;
a filter assessment module that transforms the sampled input voltage into a first power spectral density, transforms the sampled output voltage into a second power spectral density, obtains a design spectral rejection image of the ripple cancellation filter based on a concurrent pulse width modulator output, multiplies the first power spectral density by the design spectral rejection image to obtain a test spectral power density, and indicates a degraded performance of the ripple cancellation filter in the event that the test and second power spectral densities fail to match within pre-determined criteria.

14. The apparatus of claim 13 wherein the pre-determined criteria include a difference of less than 5% between power integrals across a sample bandwidth surrounding a fundamental noise frequency.

15. The apparatus of claim 14 wherein the sample bandwidth is not less than +/−1% of the fundamental noise frequency.

16. The apparatus of claim 15 wherein the sample bandwidth is not more than +/−10% of the fundamental noise frequency.

17. The apparatus of claim 14 wherein the fundamental noise frequency is established as a multiple of a pulse width modulator switching frequency.

18. The apparatus of claim 14 wherein the fundamental noise frequency is established as a frequency corresponding to a maximum of the first power spectral density function.

19. An apparatus comprising:
a pulse width modulator;
an image processing module that receives an input signal including switching noise produced by the pulse width modulator;
a ripple cancellation filter that samples the pulse width modulator output voltage to produce a rejection image for removing the switching noise from the input signal to the image processing module; and
a filter assessment module, electrically connected to both an input and an output of the ripple cancellation filter, that transforms the pulse width modulator output voltage into a first power spectral density, transforms an output voltage non-invasively sampled from the ripple cancellation filter into a second power spectral, multiplies the first power spectral density by the rejection image to produce a test power spectral density, and indicates to the image processing module a degraded performance of the ripple cancellation filter in the event that the test and second power spectral densities fail to match within pre-determined criteria.

20. The apparatus of claim 19 wherein the pre-determined criteria include a difference of less than 5% between power integrals across a sample bandwidth surrounding a fundamental noise frequency.

* * * * *